United States Patent
Friedman et al.

(10) Patent No.: US 7,511,543 B2
(45) Date of Patent: Mar. 31, 2009

(54) AUTOMATIC STATIC PHASE ERROR AND JITTER COMPENSATION IN PLL CIRCUITS

(75) Inventors: Daniel J. Friedman, Sleepy Hollow, NY (US); Yong Liu, Cambridge, MA (US); Woogeun Rhee, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 55 days.

(21) Appl. No.: 11/672,737

(22) Filed: Feb. 8, 2007

(65) Prior Publication Data
US 2008/0191746 A1 Aug. 14, 2008

(51) Int. Cl.
H03L 7/06 (2006.01)
(52) U.S. Cl. .............. 327/156; 327/147; 327/157; 327/158; 327/159
(58) Field of Classification Search .......... 327/156, 327/157
See application file for complete search history.

(56) References Cited

U.S. PATENT DOCUMENTS 5,909,130 A 6/1999 Martin et al.
6,621,354 B1 * 9/2003 Kornblum et al. .......... 331/14
6,714,083 B2 * 3/2004 Ishibashi .................... 331/1 A

OTHER PUBLICATIONS

P. Restle et al., Timing uncertainty measurement on the Power5 microprocessor, ISSCC, Feb. 2004; 8 pages.

M. Ishida et al., A programmable on-chip picosecond jitter-measurement circuit without a reference-clock input, ISSCC, Feb. 2005; 3 pages.

G. Wei et al., A 500 MHz MP/DLL clock generator for 5 Gb/s backplane transceiver in 0.25 um CMOS, ISSCC, Feb. 2003; 8 pages.

H. Huh et al., Comparison frequency doubling and charge pump matching techniques for dual-band delta-sigma fractional-N frequency synthesizers, JSSC, Nov. 2005; 9 pages.

J-S. Lee et al., Charge pump with perfect current matching characteristics in phase-locked loops, Electronics Letters, Nov. 2000, pp. 1907-1908.

Woogeun Rhee, "Method and Apparatus for On-Chip Phase Error Measurement to Determine Jitter In Phase-Locked Loops" U.S. Appl. No. 11/622,166, filed Jan. 11, 2007.

(Continued)

*Primary Examiner*—Kenneth B Wells
*Assistant Examiner*—John W Poos
(74) *Attorney, Agent, or Firm*—Keusey, Tutunjian & Bitetto, P.C.; Anne V. Dougherty, Esq.

(57) ABSTRACT

An instantaneous phase error detector (IPED) and method includes a first gate configured to logically OR output phase error signals as data to a first latch, and a second gate configured to logically combine the output phase error signals to clock the first latch. A delay element delays to the data to the first latch where the output of the first latch provides instantaneous phase error change information. A second latch is coupled to the output phase error signals to output a lead/lag signal to indicate which of the output phase error signals is leading. A phase-locked loop employing the output of the IPED is also disclosed along with static phase measurement and jitter optimization features.

17 Claims, 8 Drawing Sheets

OTHER PUBLICATIONS

Yong Liu et al., "All-Digital Dynamic Self-Detection and Self-Compensation of Static Phase Offsets in Charge-Pump PLLs", IEEE International Solid-State Circuits Conference; Feb. 11, 2007; pp. 176-177 and 595.

Amber Han-Yuan Tan et al., "Phase Mismatch Detection and Compensation for PLL/DLL Based Multi-Phase Clock Generator", IEEE 2006 Custom Intergrated Circuits Conference; 2006; pp. 417-420.

* cited by examiner

AUTOMATIC STATIC PHASE ERROR AND JITTER COMPENSATION IN PLL CIRCUITS

BACKGROUND

1. Technical Field

The present invention generally relates to performance enhancement in phase-locked loop (PLL) circuits, and more particularly to automatic static phase error and jitter compensation in PLL circuits.

2. Description of the Related Art

As integrated circuit technology advances, it becomes more and more difficult to predict and to control, within tight tolerances, the behavior of integrated circuit elements. These integrated circuit elements may include transistors as well as passive elements such as resistors and capacitors. In addition, non-idealities in the performance of key circuit elements such as current mirrors also tend become more and more pronounced with each ensuing technology generation.

As the variability in individual devices grows and as device performance departs further and further from the ideal, it becomes increasingly important to identify efficient ways to compensate for process, voltage, temperature, and aging effects in integrated circuits.

One broad approach to addressing these problems is to convert aspects of circuits that are implemented in an open loop, and correct them by designs with blocks implemented using closed loop feedback techniques. Such a transition needs a sensor that can measure performance of the circuit block against a specification, an actuator that can effect a change in the performance of the circuit block, and a control loop that ensures that the actuator is controlled in such a way that circuit block performance is brought closer to the target when the loop is active.

The problems associated with advancing integrated circuit technology strongly affect analog circuits, and particularly phase-locked loop (PLL) circuits. One key metric of PLL performance is static phase error. The static phase error is a long-term value of a time difference between an arrival time of an input reference clock and a PLL feedback clock at the input of the PLL's phase and frequency detector block. While it is typically desirable to minimize this quantity, there may also be cases in which it is desirable to drive this quantity to a known, pre-set value.

Another key metric of PLL performance is its output jitter. Again, while it is typically desirable to minimize this quantity, there may also be cases in which it is desirable to drive characteristics of this quantity to a known value, as in multi-PLL systems where the matching of jitter characteristics is important.

Static phase error minimization described in the art has typically relied upon open-loop techniques that improve the underlying baseline performance of PLL sub-circuits. Such approaches do not treat static phase error directly as a quantity to be measured and then compensated. Furthermore, these techniques do not allow for the achievement of a target non-minimum static phase error. Similarly, approaches to jitter minimization have focused on open-loop techniques that improve the underlying baseline jitter behavior of the overall PLL, Such approaches do not enable optimization of the PLL as a function of the noise content of the input reference signal, for example.

SUMMARY

In accordance with the present embodiments, the creation of new feedback loops for the optimization of phase-locked loops (PLL) static phase error and jitter performance is provided. Thus, the present system first enables the realization of an efficient way to automatically adjust the static phase error of a PLL, either to a minimum value or to a specific target mean value. This can be used during PLL operation, enabling the minimum or target phase error value to be dynamically maintained. In another aspect, the present system enables the realization of an efficient way to automatically optimize the jitter performance of a PLL.

Methods and systems for dynamic optimization of static phase error of a PLL are disclosed. In illustrative embodiments, a method and system for the dynamic optimization of jitter performance of a PLL are described. An instantaneous phase error sensing circuit is disclosed. The static phase error feedback loop includes a sensor taking the form of an instantaneous static phase error detector block attached to appropriate internal PLL signals, an actuator taking the form of circuits that can intentionally mismatch charge pump currents, and a control system that uses sensor input to determine actuator settings, taking the form of a finite state machine.

Similarly, the jitter optimization feedback loop uses the instantaneous static phase error detector block as its sensor, elements that affect the bandwidth of the PLL (such as a voltage controlled oscillator (VCO) gain and charge pump current) as its actuators, and a control system that computes jitter properties of the PLL from accumulated sensor output to determine actuator settings, again taking the form of, e.g., a finite state machine.

An instantaneous phase error detector (IPED) includes a first gate configured to logically OR output phase error signals as data to a first latch, and a second gate configured to logically combine the output phase error signals to clock the first latch. A delay element delays the data to the first latch where the output of the first latch provides instantaneous phase error change information. A second latch is coupled to the output phase error signals to output a lead/lag signal to indicate which of the output phase error signals is leading, A phase-locked loop employing the output of the IPED is also disclosed along with static phase measurement and jitter optimization features.

A method for optimizing phase-locked loops (PLL) by measuring instantaneous phase error to adjust static phase error and jitter performance includes logically ORing phase error signals output from a first phase-frequency detector as data to a first latch and logically combining the output phase error signals to clock the first latch. The data is delayed to the first latch where the output of the first latch provides a magnitude of instantaneous phase error change. A lead/lag signal is output to indicate a direction of which of the phase error signals is leading. A control signal is generated based on the magnitude and direction, and responsive to the control signal, a charge pump is controlled to adjust a voltage controlled oscillator.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
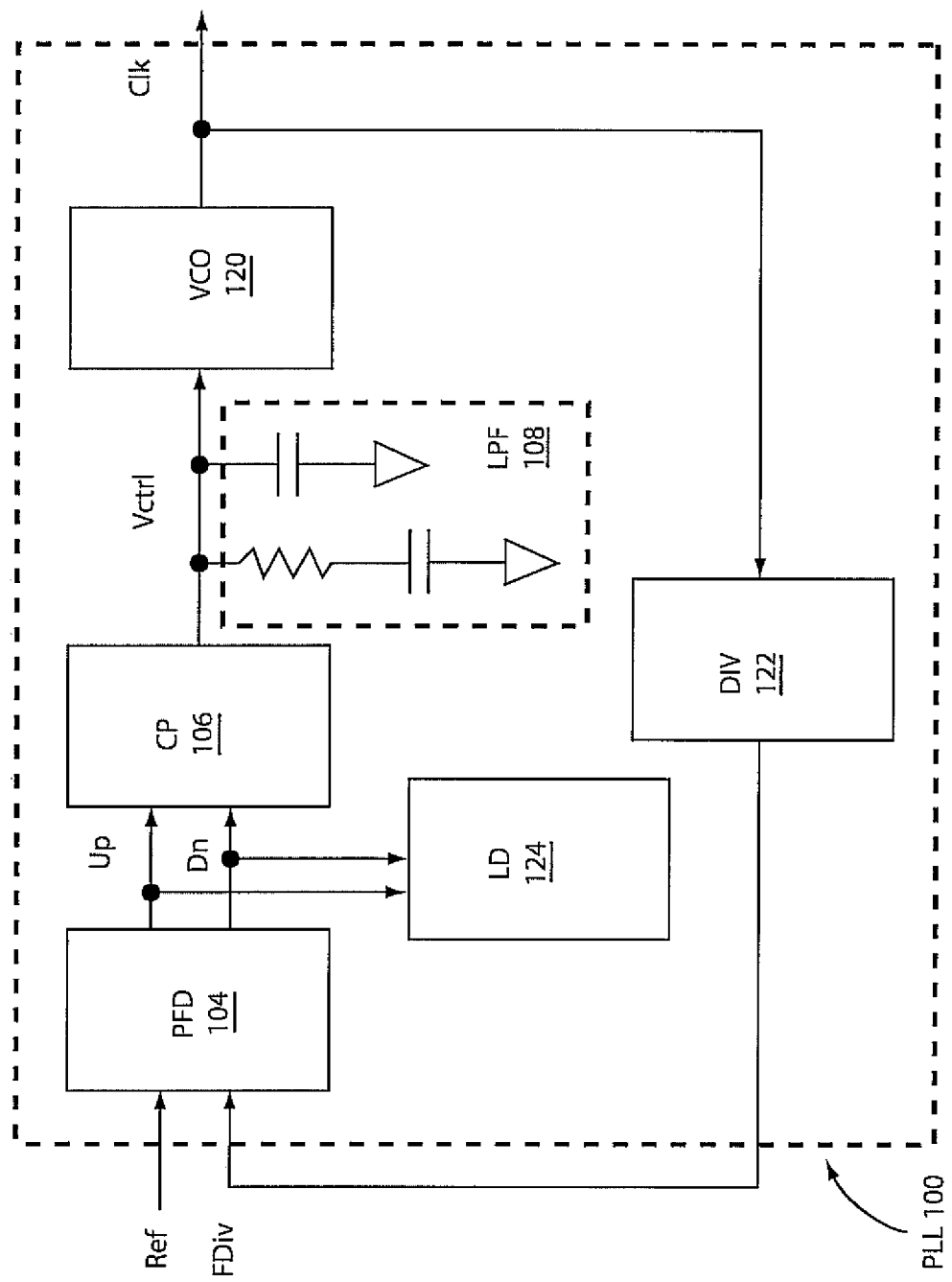
FIG. 1 is a block diagram showing a conventional phase-locked loop (PLL)

Embodiments in accordance with the present principles address the following issues. An efficient way to automatically adjust static phase error of a phase locked loop (PLL) is addressed. Typically, it is desirable for PLL static phase error to be as close to zero as possible. In accordance with one feature, automatic realization of a minimum mean static phase error is provided, or, alternately, the realization of a given fixed target value of static phase error. In both cases, the static phase error is dynamically maintained during PLL operation.

A second issue that is addressed includes the development of an efficient way to automatically optimize the jitter performance of a PLL. In general, overall PLL jitter performance is dependent on both internally generated jitter (such as from a voltage controlled oscillator (VCO)) as well as unknown external sources of jitter (such as from a reference clock). One way to optimize PLL jitter performance is to dynamically adjust PLL bandwidth to identify the point at which the combination of in-band noise (often dominated by input reference clock noise, especially for high multiplier values) and out-of-band noise (dominated by VCO phase noise) is minimized. One feature in accordance with the present principles provides a way of measuring PLL jitter and dynamically adjusting loop bandwidth, enabling real-time jitter performance optimization.

Embodiments of the present invention can take the form of an entirely hardware embodiment, an entirely software embodiment or an embodiment including both hardware and software elements. In a preferred embodiment, the present invention is implemented in hardware, such as an integrated circuit or the like but may also be implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The circuits described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GDSII)) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

In particularly useful embodiments, there are several components of note: (1) An instantaneous phase error detector (IPED) logic implementation includes improvements including a replacement of a XOR gate as described in commonly assigned U.S. patent Ser. No. 11/622,166, to Rhee et al., entitled "METHOD AND APPARATUS FOR ON-CHIP PHASE ERROR MEASUREMENT TO DETERMINE JITTER IN PHASE-LOCKED LOOPS" filed on Jan. 11, 2007, incorporated herein by reference, with an OR gate. In addition, the IPED output is extended to provide a lead/lag indicator as an output along with the magnitude of the instantaneous phase error. (2) An apparatus and method to use a phase offset detector within a control loop to compensate for static phase error is provided. In one particular embodiment, measurement of the static phase error is accomplished using the IPED ability to provide sign and magnitude information about the instantaneous static phase error in the PLL. Control of a charge pump offset current is employed to effect phase error adjustments. This control mechanism may include introducing intentional mismatch in the charge pump current. Offset control is digital in the implementation described here but could be analog as well. The reduction in static phase error provides a secondary benefit in the reduction in reference spur amplitude. (3) An apparatus and method to use the IPED within a control loop to automatically adjust PLL loop parameters to minimize overall PLL jitter is provided. Measurement of the jitter is accomplished using accumulated data from the IPED output. Parameters that can be adjusted in this implementation to effect noise reduction include VCO gain (by adjusting an operating point on the VCO tuning curve) and absolute charge pump current, but other parameters may also be contemplated as candidates for adjustment.

Referring now to the drawings in which like numerals represent the same or similar elements and initially to FIG. 1, a block diagram of a conventional phase-locked loop (PLL) system 100, which comprises a phase-frequency detector (PFD) 104, a charge pump (CP) 106, a loop filter (LPF) 108, a voltage-controlled oscillator (VCO) 120, a frequency divider (DIV) 122, and a lock detector (LD) 124, is shown. The PFD 104 compares the phase of an incoming reference clock, Ref, with that of a feedback clock, FDiv, the latter is provided at the output of the frequency divider (DIV) 122. The PFD 104 generates logic outputs (Up and Dn) at varying pulse widths that are provided to the charge pump 106. The charge pump 106 generates an error voltage (Vctl) to tune the VCO frequency. The loop filter 108 between the PFD 104 and the VCO 120 rejects high frequency noise, and, along with other loop components, determines characteristics of the overall PLL behavior. The frequency divider 122 is generally used to enable the VCO frequency Clk to be higher than that of the reference clock frequency Ref. The lock detector 124 is often used in the PLL 100 to provide an indication of the PLL lock status.

The PFD 104 compares the phase of the incoming reference clock (Ref) to that of the feedback clock (FDiv) at the frequency divider output (from DIV 122) and generates pulse-width modulated signals that are provided to the CP 106. The CP 106, in conjunction with the loop filter (108), produces an error voltage (Vctrl) that is used to tune the VCO frequency. The loop filter 108 between the PFD 104 and the VCO 120 rejects high frequency noise. The frequency divider 122 is generally used to enable the VCO frequency to be higher than that of the reference clock frequency (Ref). The lock detector 124 is often used in the PLL to indicate whether or not the PLL is operating in a locked condition.

One key parameter of PLL performance is its static phase error. This term can be understood as the average difference between the arrival times of the reference clock (Ref) and the feedback clock (FDiv) when the PLL is operating in its locked condition. The averaging of the arrival time distance, or instantaneous phase error, can be considered over a variety of time windows, generally chosen based on what long-term (or "static") phase error information is relevant to system operation.

In a typical PLL, static phase error can arise from sources such as PFD mismatch and CP mismatch. Designers attempt to minimize instantaneous and static phase error by optimizing the design of the PLL components. This strategy has limitations, however, particularly as component non-idealities grow. It is the case, for example, that as the output voltage of the charge pump circuit moves away from its mid-range value, undesirable growth will occur in the mismatch between the current generated in response to "Up" pulses as compared to current generated in response to "Down" or Dn pulses.

Furthermore, as CP output voltage moves from mid-range in differential charge pumps, which are designed to generate balanced currents during the tri-state mode when neither the "Up" or "Down" CP inputs are asserted, will start to generate less and less balanced currents. In these situations, the PLL compensates for the offset currents by introducing a phase offset sufficient to balance the current error. If the conditions that led to the introduction of the phase offset are constant, the resulting phase error between the divided clock and the reference clock will persist and take on a long time constant, or static, characteristics. Note that even if the primary source of the mismatch is something other than those given in the examples described above, the PLL will act to compensate for the mismatch by introducing phase error.

Long-term or static phase error in PLLs typically has negative effects on system performance. One example of such an effect can be described as follows. Because the PLL generates pulsewidth modulated signals once per reference clock cycle in order to apply the phase and frequency corrections needed to keep the loop in lock, the larger the phase error, the wider the pulse the PLL applies to the loop filter and to the VCO in each reference clock cycle. The wider this pulse, the greater the energy at the reference clock frequency that is applied to the loop and hence the greater the amplitude of the undesirable reference clock spur in the output spectrum becomes.

Figure 2:
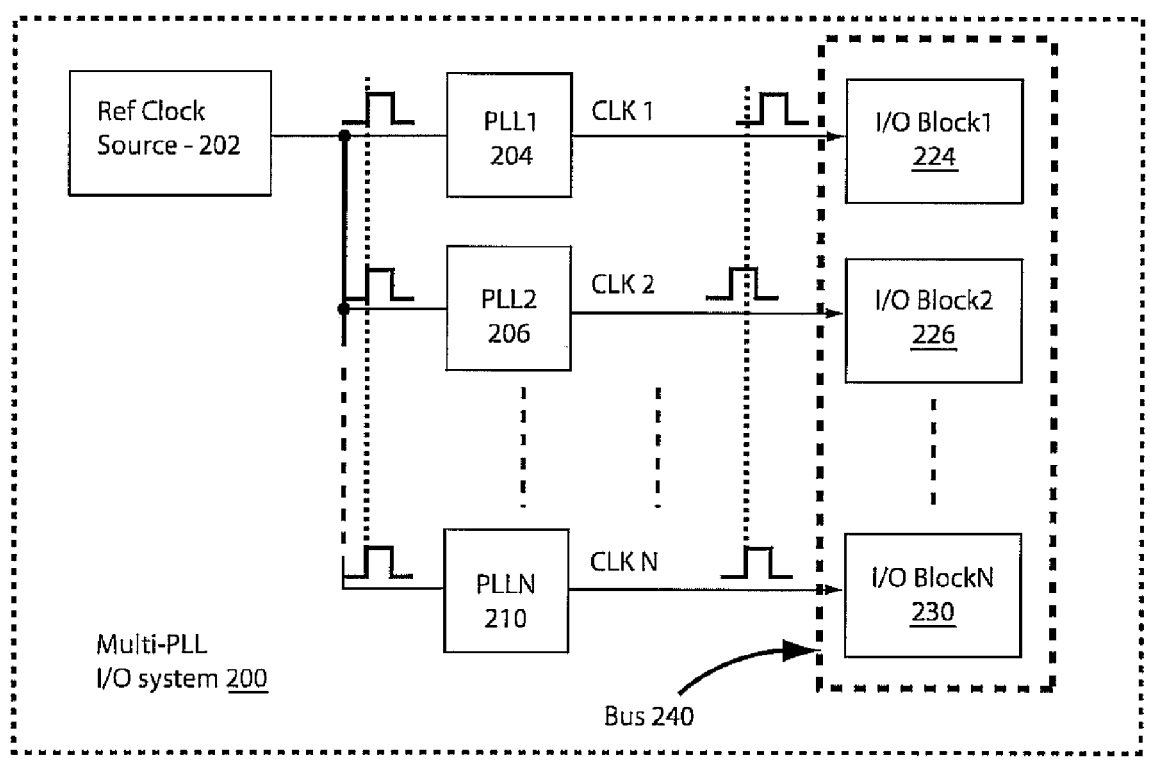
FIG. 2 is a block diagram showing a typical multi-PLL bus application for which PLL static phase error is a critical parameter.

Referring to FIG. 2, a second example of the negative effect of static phase error in PLL systems is illustratively shown. A multi-PLL input output (I/O) system 200 includes multiple PLLs (PLLs 204, 206, 210), each PLL receiving a reference clock from a common reference clock source 202. The PLLs, numbered 1 to N (i.e. PLL1, PLL2, ... PLLN), each generate a corresponding output clock, e.g., CLK1, CLK2, ... CLKN, that provides the clock for an associated input/output (I/O) block 224, 226, ... 230, where each I/O block may include multiple individual I/O elements. Specifically, PLL1 204 generates output clock CLK1 for I/O block 224, PLL2 206 generates output clock CLK2 for I/O block 226, and PLLN 210 generates output clock CLKN for I/O block 230.

If it is desired that I/O blocks 224, 226, and 230 be combined in a bus 240, the static phase error differences among PLLs 204, 206, and 210 will become direct contributors to word alignment mismatch across I/O block boundaries. This result can lead to a requirement for external alignment mechanisms or latency-increasing deeper alignment buffers on the receive side I/O macros.

All circuit and block diagram figures and descriptions are presented here using single-ended conventions. The apparatus and methods described herein, however, are not restricted to application in single-ended designs; instead, single-ended, differential, and mixed single-ended/differential implementations are also contemplated. Note further that control signals for base and offset currents described herein are presented as digital, but analog embodiments of such control signals (including, if necessary, digital-to-analog converters), are also contemplated.

To enable the compensation of static phase offset, a sensing circuit that measures the offset is needed. This may be provided by employing an instantaneous phase error detector (IPED), which determines, with the arrival time of each reference clock, whether the phase offset is greater than or less than a delay.

Figure 3:
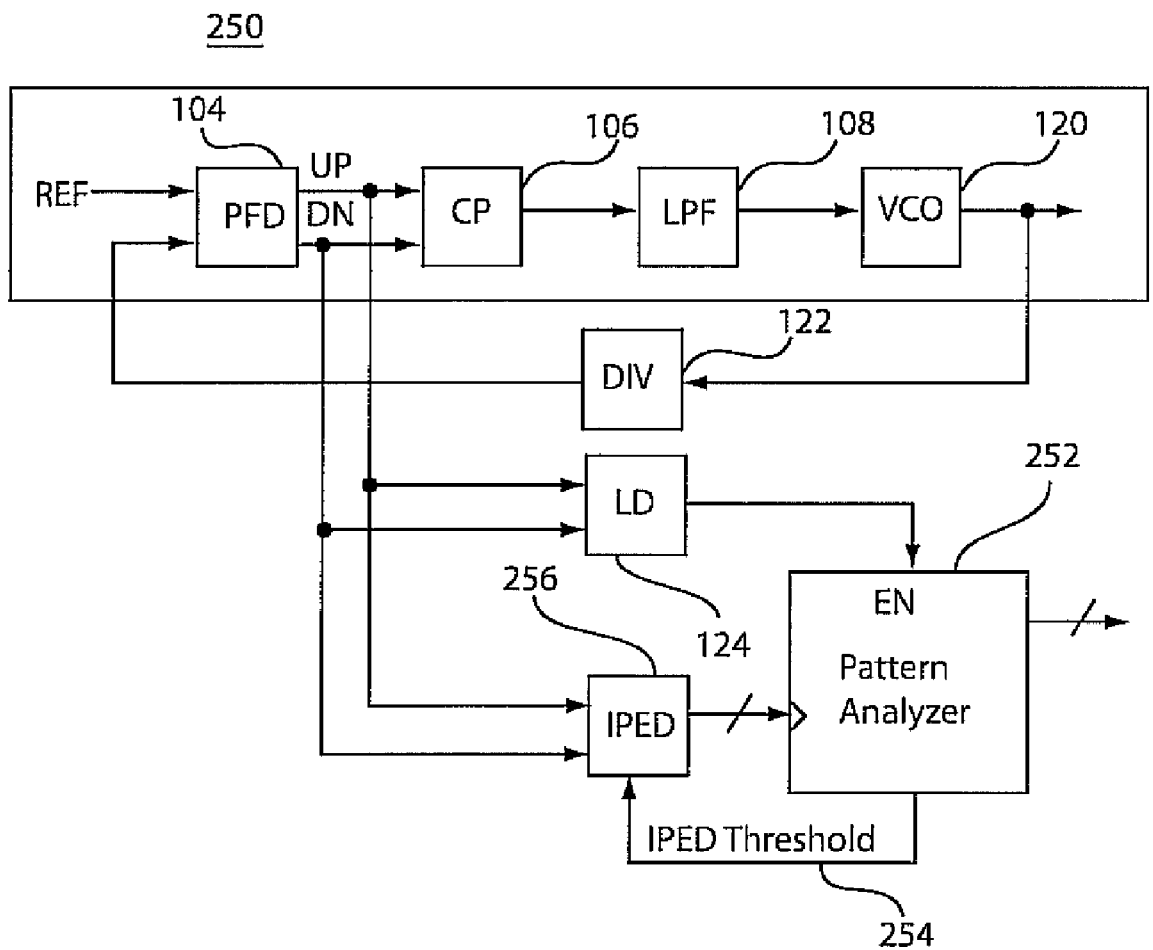
FIG. 3 is a block diagram showing a PLL with and instantaneous static phase error detector (IPED) and pattern analyzer in accordance with the present principles.

Referring to FIG. 3, a block diagram of a PLL 250 with an instantaneous phase error detector (IPED) 256 and a pattern analyzer system 252 are illustratively shown in accordance with present principles. By employing digitally programmable peak instantaneous phase error detection boundaries or thresholds 254, the all-digital IPED 256 enables multi-threshold peak phase error movement detection; when combined with post-processing in a pattern analyzer block 252 which could reside on-chip or off-chip, sequences of phase error measurements can be converted to jitter estimates. Multiple thresholds may be provided by employing a programmable delay line or lines.

The IPED 256 acts as an instantaneous phase error detector at each reference clock cycle. The accumulation of the instantaneous phase error information can be converted to jitter. The IPED boundary describes a transition between a delay step where the IPED output is low and where it is high. An IPED threshold is the delay beyond which the instantaneous static phase error would yield an output 1. The difference between IPED delay boundary and IPED delay threshold is that the IPED threshold is input referred (e.g., it is the actual trip point in pulse width where IPED output goes high), and the IPED boundary is output referred.

Since the IPED 256 takes PFD logic outputs, UP and DN, which include phase error information based on pulse width modulation, the IPED 256 can be considered an extensive time-to-digital converter. The pattern analyzer 252 collects the digital outputs captured by the IPED 256 and its post-processing provides useful data analysis such as a jitter histogram, lock detection, static phase offset and so on. These concepts were described in the previously cited disclosure to Rhee et al., which was incorporated herein by reference above.

Figure 4:
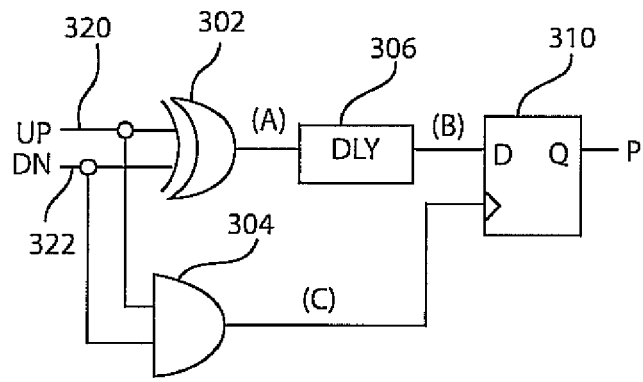
FIGS. 4 and 5 show block diagrams of two implementations of an instantaneous static phase error detector (IPED)
Figure 5:
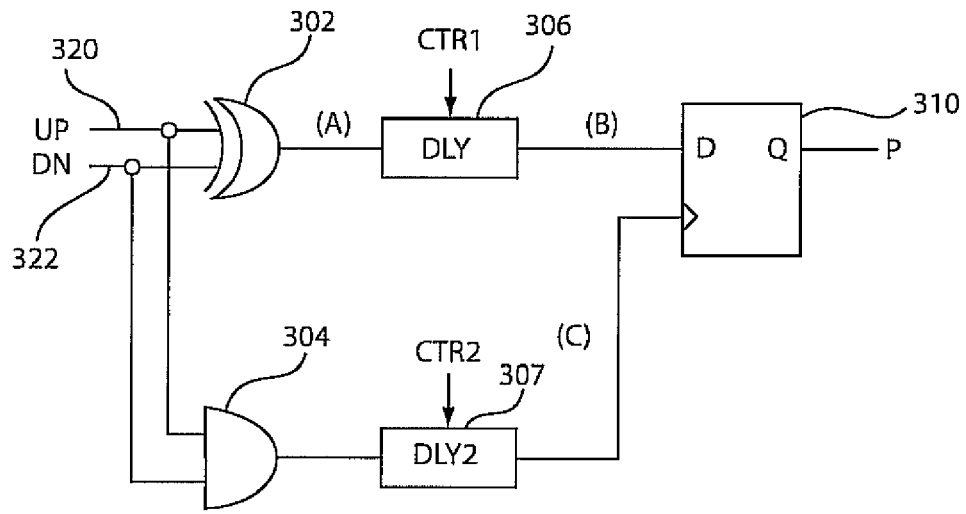
Figure 6:
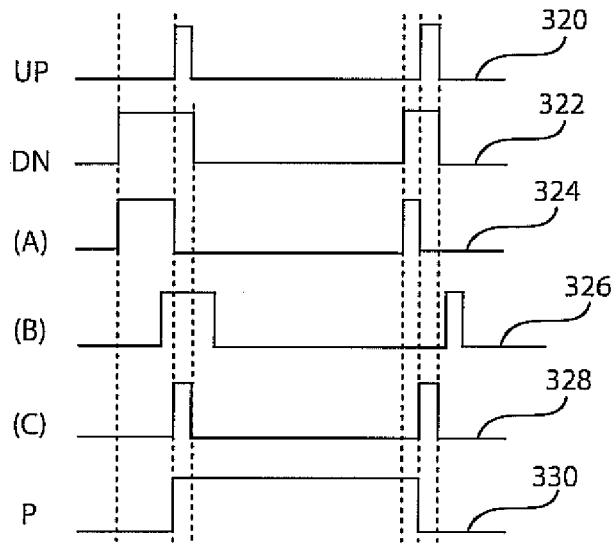
FIG. 6 is a timing diagram showing signal timing in accordance with FIGS. 4 and 5.

Illustrative IPEDs 256 are shown in FIGS. 4 and 5 and a timing diagram for the IPEDs 256 are illustratively shown in FIG. 6.

Referring to FIGS. 4, 5 and 6, an UP input 320 and the DN input 322 are provided to an exclusive-OR (XOR) gate 302 and AND gate 304. In each case, the output of XOR gate 302 is provided to a delay 306 (e.g., a delay element or delay line), the output of which is connected to the data port of a flip-flop 310. In the form of the circuit without insertion delay compensation (FIG. 4), the AND gate 304 output is used directly as the clock for the flip-flop 310. In the form of the circuit with insertion delay compensation (FIG. 5), the AND gate 304 output is used as the clock for flip-flop 310 after passing through a second delay element 307.

The timing diagram in FIG. 6 shows exemplary behavior of inputs UP 320, DN 322, signal 324 at internal node A, signal 326 at internal node B, signal 328 at internal node C, and signal 330 at output P.

In the block diagram shown in FIG. 4, the IPED output P 330 will be high if the delay time associated with delay element 306 is less than the magnitude of the instantaneous phase error between the UP input 320 and the DN input 322; otherwise it will be low.

In the block diagram shown in FIG. 5, the IPED output P 330 will be high if the delay time associated with delay element 306 minus that associated with second delay element 307 is less than the magnitude of the instantaneous phase error between the UP input 320 and the DN input 322. Otherwise, P 330 will be low. Delay element 307 is added to enable compensation of the non-zero minimum delay associated with delay element 306, thus bringing the minimum detectable instantaneous phase error closer to 0. Further note that it is possible to extend the resolution of the IPED block by cascading delay lines and latching multiple delay line outputs, by implementing the delay elements as controllable delay elements, or by combinations of these approaches, among other things.

Figure 7:
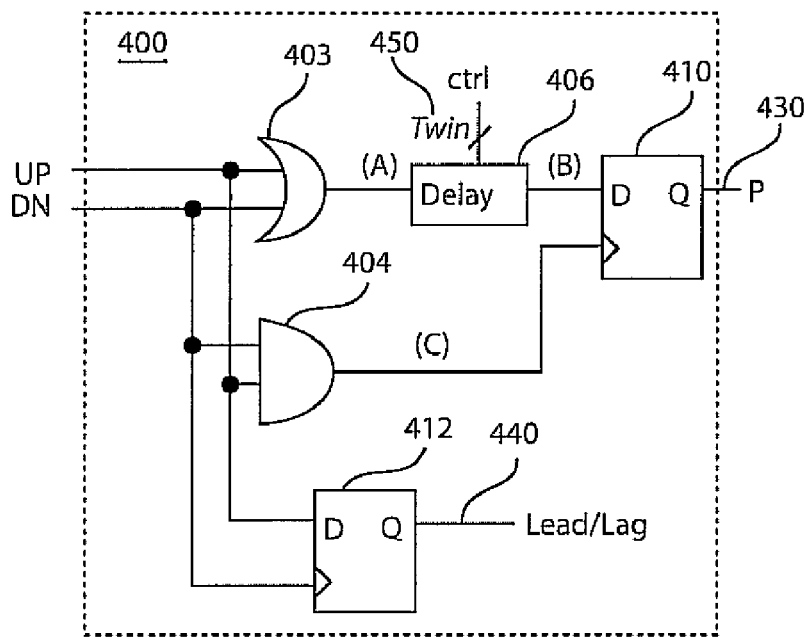
FIG. 7 is a block diagram showing an enhanced IPED in accordance with one embodiment.

Referring to FIG. 7, an enhanced version of the IPED 400 is illustratively shown. The XOR gate 302 of FIG. 4 has been replaced with an OR gate 403. A rising edge of the output of AND gate 404 (signal C 428) effectively masks the portion of signal A (424 in FIG. 8, 324 in FIG. 6) that is present in the FIG. 7 implementation and absent in FIG. 4. Thus, the OR gate 403 replaces the XOR gate 302 and has no first-order effect on IPED performance while also simplifying the design.

Another difference provided by the structure 400 includes the addition of a latch 412. The latch 412 provides an output signal 440 (Lead/Lag), which provides information about which of the signals, UP or DN, leads the other.

In an ideal PLL, excess width on the UP signal indicates that the reference clock leads the feedback clock and thus the VCO should go faster, while excess width on the UN signal indicates that the divided clock leads the reference clock and thus the VCO should go slower. The addition of the lead/lag signal provides sign information about the instantaneous phase error, enabling a correction loop to provide appropriate feedback. Note that the insertion delay compensation enhancement shown in FIG. 5 can be added to the circuit shown in FIG. 7 by adding a delay line between AND gate 404 and a clock input to latch 410.

Note further that, as described above, the version of the IPED 400 shown in FIG. 7 can also be extended in resolution by cascading delay lines and latching multiple delay line outputs, by implementing the delay elements as controllable delay elements, or by combinations of these approaches, among others.

In FIG. 7, a delay element 406 is shown to have a nominal delay "Twin" 450. The timing diagram in FIG. B shows the behavior of the enhanced IPED circuit 400 in response to three example relationships between the UP and DN signals.

Figure 8:
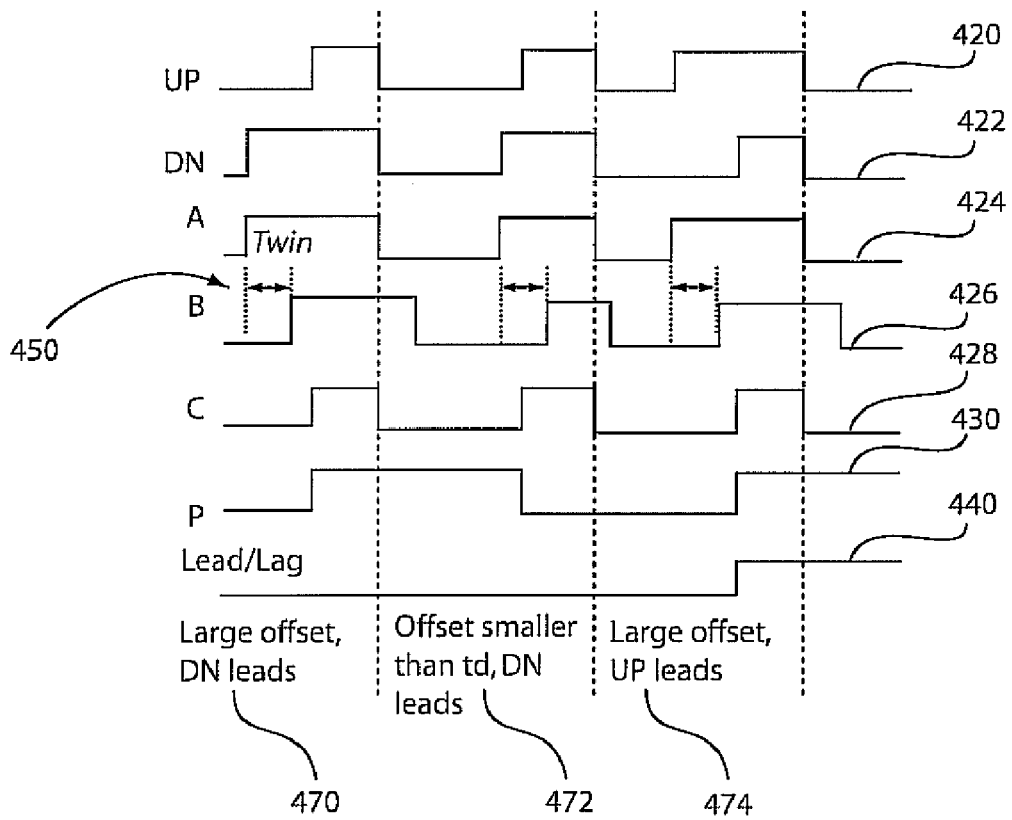
FIG. 8 is a timing diagram illustratively showing signal timing for the circuit of FIG. 7.

Referring to FIG. 8, in region 470, to the left of the leftmost dotted line, a case is shown in which there is a large offset (greater than Twin 450) with the DN signal leading the UP signal, resulting in a high output P 430 and a low Lead/Lag output 440. In region 472, between the leftmost dotted line and the middle dotted line, a case is shown in which there is a small offset between DN and UP, resulting in a low output P 430. Because the DN signal still leads the UP signal in this case, the Lead/Lag output 440 is also low. td is the delay time.

In a third case, shown in region 474' between the middle dotted line and the rightmost dotted line, UP leads DN by a large amount (greater than Twin 450), resulting in a high output P 430 and a high output Lead/Lag 440. In general then, it can be seen that the IPED structure described by FIG. 7 provides both instantaneous phase offset magnitude information and sign information as will be desirable for an automatic phase offset compensation loop.

Figure 9:
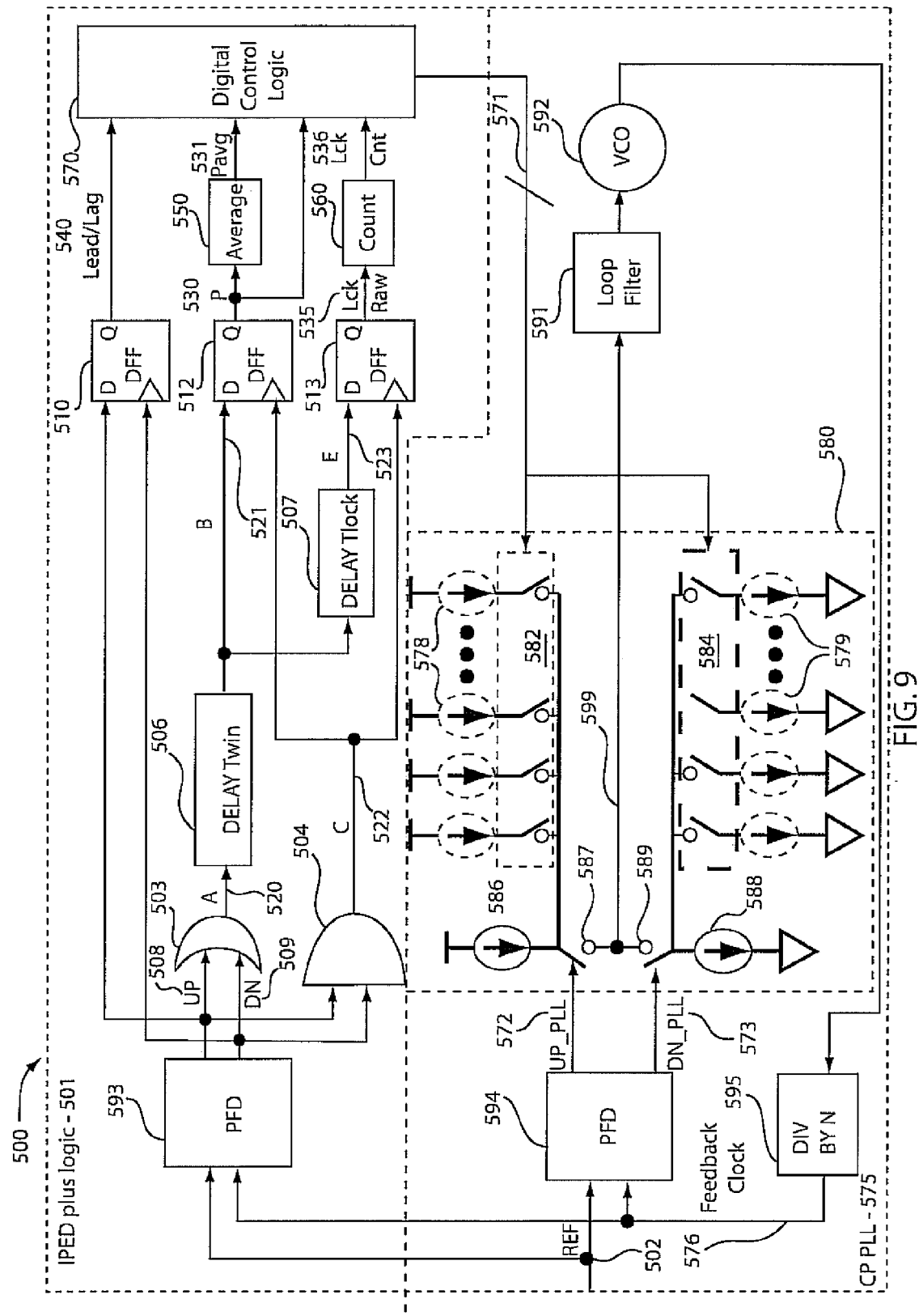
FIG. 9 is a schematic diagram showing an IPED, logic, and a modified charge pump PLL (CP PLL) enabling implementation of static phase offset minimization, the realization of targeted static phase offset values, the implementation of dynamic jitter optimization, and/or the implementation of targeted jitter performance, in accordance with one illustrative embodiment.

Referring to FIG. 9, one preferred embodiment of an automatic static phase offset compensation circuit 500 is illustratively shown. The overall static phase offset compensation circuit 500 is comprised of two main sub-blocks, namely, an IPED plus logic block 501 and a charge pump PLL 575 with additional charge pump control inputs. In this embodiment, the IPED 501 uses a PFD 593 separate from PFD 594 used in the CP PLL block 575 to compare the phase of the REF input 502 to that of a feedback clock 576.

Similarly to the circuit of FIG. 4, the IPED portion of the IPED plus logic block 501 uses a resulting UP signal 508 and a DN signal 509 to create intermediate outputs A 520 and C 522, and by passing the signal at A 520 through a delay element 506 having delay Twin, to provide an intermediate output B 521. Raw phase magnitude information is captured in a D-flip-flop (DFF) 512 and distributed to an average block 550 for averaging using signal P 530. Lead/lag information is captured in DFF 510 and distributed to digital control logic 570 using signal line Lead/Lag 540. Lock information is captured by comparing the phase error against a wider time span, Twin plus Tlock (implemented by feeding delay 506 output through a second delay 507) and capturing the phase error comparison in DFF 513.

The output of the lock circuit Lck Raw 535 is provided to a count macro 560 that serves to validate the quality of the lock. The output of average block 550 (Pavg 531) and that of count block 560 (Lck Cnt) are distributed to digital control logic block 570.

The exemplary IPED plus logic block 501 takes reference clock 502 and feedback clock 576 inputs (or UP input 508 and DN input 509, depending on whether PFD 593 is considered part of the IPED or not), performs measurements on the phase relationship between those input signals, and then performs post-processing on those measurements to produce a control word that can be used to modify the behavior of the CP PLL 575.

The exemplary CP PLL portion 575 of the automatic static phase offset compensation circuit 500 is comprised of PFD 594, a divide-by-N block 595, a loop filter 591, a voltage controlled oscillator (VCO) 592, and a dual-control mode charge pump 580. The exemplary PLL follows a standard architecture except for some modifications such as e.g., changes made to the charge pump 580. The charge pump 580, drawn as a single-ended structure (although the principles discussed here are fully applicable to differential charge pump architectures as well), includes a main current source 586 which is connected to a summing node 599 upon the activation of a switch 587 via the assertion of a logic high signal on PFD 594 output UP_PLL 572. The charge pump 580 also includes a main current sink 588 which is connected to summing node 599 upon the activation of a switch 589 via the assertion of a logic high signal on PFD 594 output DN_PLL 573.

In response to a digital control word 571, additional current sources 578 can be connected in parallel with current source 586 via the action of switches 582, and additional current sinks 579 can be connected in parallel with current sink 588 via the action of switches 584. The output of the current summing node 599 is connected to the loop filter 591, the output of which in turn provides the control voltage for VCO 592. The output of VCO 592 is connected to the divide-by-N block 595 which provides the feedback clock input 576 to PFD 593 and PFD 594, the phase of which is compared to that of the input reference clock 502. The divide-by N block 595 permits clock rate adjustment for to increase or decrease the clock rate by a multiple N.

The unit current sources 578 and current sinks 579 enable the creation of a controllable charge pump current mismatch between the effective amount of current requested in response to an "up" pulse as compared to that requested in response to a "down" pulse from PFD 594. Because the effect of such a charge pump current mismatch is to induce phase offset in the PLL, this structure can be used to introduce intentional phase offset that compensates for undesired naturally occurring phase offset in the system. With appropriate processing of lead/lag signal 540, Pavg signal 531, and Lck cnt signal 536 in digital control logic 570, a control word 571 that achieves this compensation can be generated. The control word may be generated based on e.g., a state table stored in or referenced by control logic 570 or other method. Note further that such a system could be used not only to minimize the phase error, but alternately to drive the phase error to a desired non-zero value.

Advantageously, the elements described in the foregoing enable static phase error minimization or the achievement of a target static phase error. An exemplary method that could be implemented in digital control logic 570 to enable static phase error minimization is illustratively shown in FIG. 10.

Figure 10:
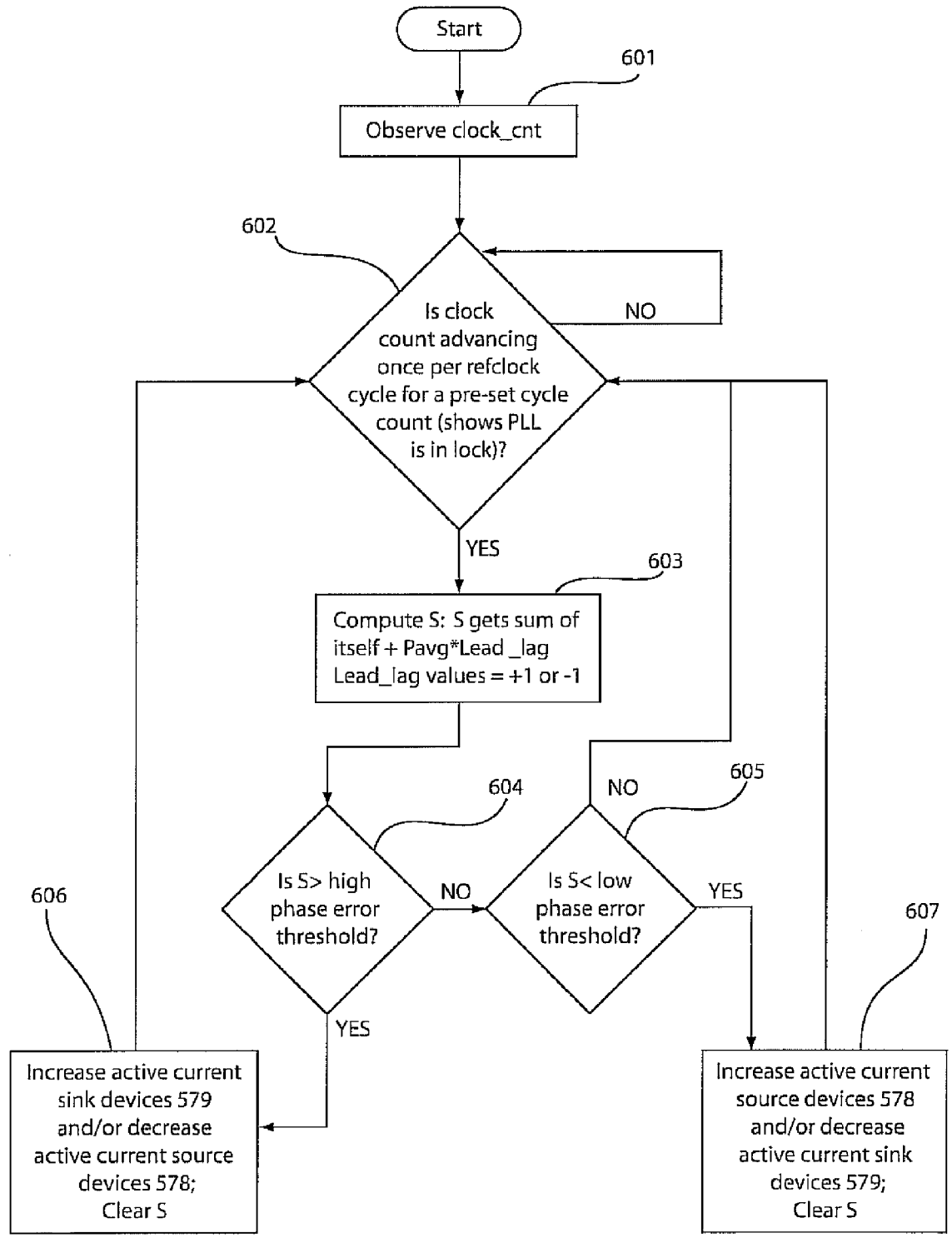
FIG. 10 is a block/flow diagram showing a method whereby static phase offset minimization may be achieved, in accordance with one illustrative embodiment.

One way to activate the offset compensation loop would be to only allow it to operate once PLL lock has been achieved. Referring to FIG. 10, in block 601 the lock count signal (536 in FIG. 9) is observed to assess whether the PLL is in lock, as by ensuring that the count is advancing on each reference clock cycle for a predetermined number of consecutive cycles, thus indicating a stable lock as shown in decision block 602. Once the lock is observed, a running total S of the phase magnitude (P or Pavg) times the sign of the phase offset (the lead/lag signal) is computed in block 603.

In decision block 604, it is determined whether the accumulated phase offset is greater than a high static phase error threshold. If so, block 606 calls for the increase in activated current sinks and/or a decrease in activated current sources, along with a clearing of the sum S and a return to block 602. If not, block 605 determines whether the accumulated phase offset is less than a low static phase error threshold. If so, block 607 calls for the decrease in activated current sinks and/or an increase in activated current sources, along with a clearing of the sum S and a return to block 602. If not, the loop returns to block 602 without clearing S. Note that this procedure is intended to be an example of a method for using the apparatus described herein; other algorithms enabling static phase offset minimization or the achievement of desired static phase offset values fall are also contemplated.

Figure 11:
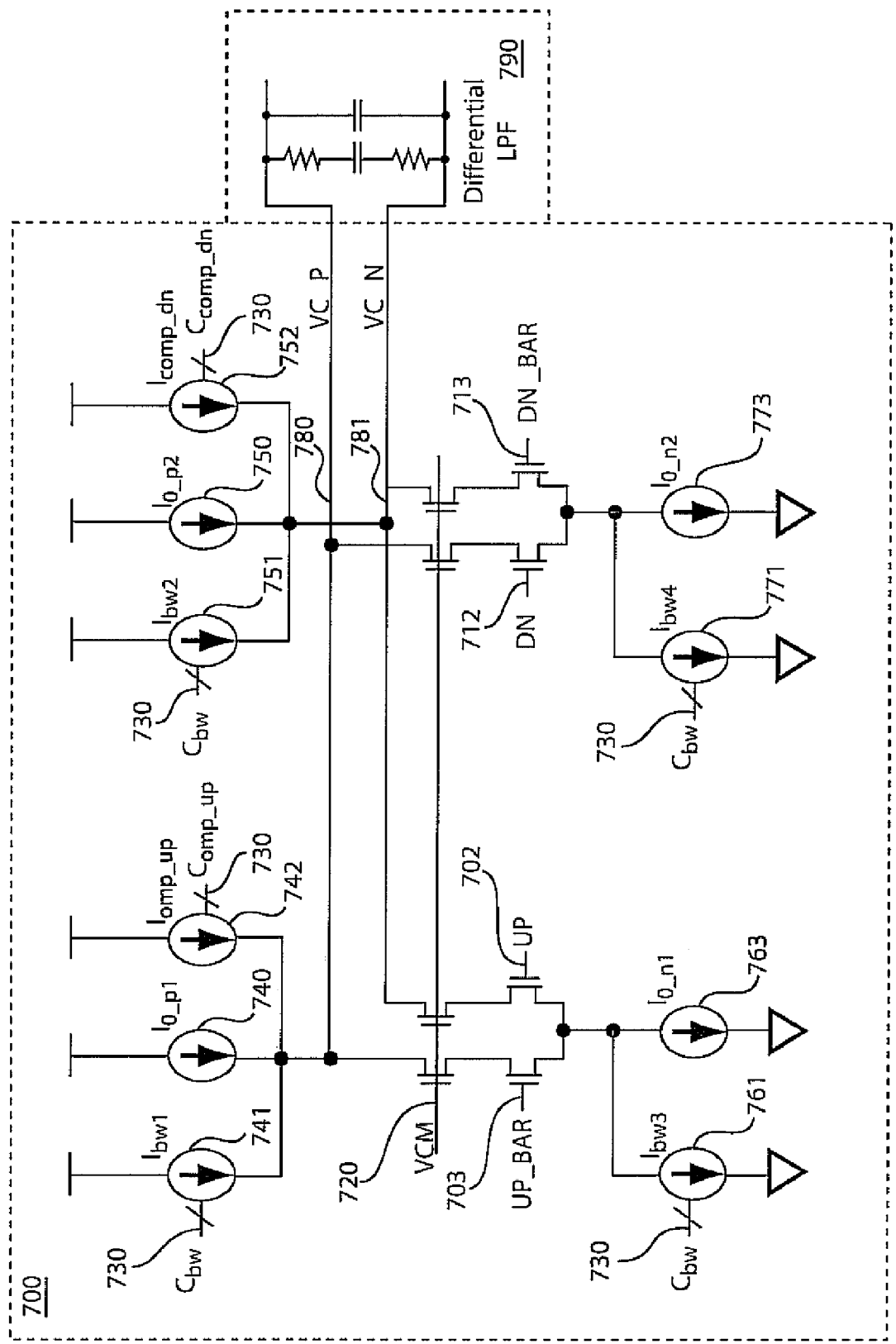
FIG. 11 is a schematic diagram showing a differential charge pump implementation with current control features enabling static phase error and jitter optimization loops, in accordance with an illustrative embodiment.

Referring to FIG. 11, an exemplary charge pump 700 is shown. Charge pump 700 serves as an actuator in the realization of the static phase offset compensation loop, and, as will be described, is employed in the realization of a jitter optimization loop. The charge pump 700 includes a differential charge pump and has an output that is connected to a differential low pass filter 790. The base current in the charge pump 700 is provided by currents $I_{o\_p1}$ 740, $I_{o\_p2}$ 750, $I_{o\_n1}$ 763, and $I_{o\_n2}$ 773. Nominally, these currents are designed to be identical. In reality, of course, the currents will vary, with their relative variation (due to the changes in the voltages present on filter nodes VC_N 780 and VC_P 781, process variation, or other sources) being one contributor to PLL static phase error. With controls $C_{bw}$, $C_{comp\_up}$, and $C_{comp\_dn}$ turned off, the charge pump will act to direct current to and from nodes VC_N 780 and VC_P 781 under the control of input signals UP 702, UP_BAR 703, DN 712, and DN_BAR 713. In this design, VCM 720 is used as part of a feedback loop (not shown) to help ensure a proper common mode voltage is maintained for the CP output.

By applying proper control signals or control words to inputs $C_{comp\_up}$ 742 and $C_{comp\_dn}$ 752, a nominal mismatch in current flowing into node VC_N 780 as compared to node VC_P 781 can be established. This effect could be accomplished with or without preservation of nominal total current flowing in the system. To preserve total current, the $C_{comp\_up}$ 742 and $C_{comp\_dn}$ 752 controls start at their midpoints to establish nominal bias and current mismatch which can be generated by matching an increase in one control with a corresponding decrease in the other control. The creation of these nominal mismatches enables the compensation of naturally occurring static phase error or the achievement of a target static phase error.

The structure shown in FIG. 9, leveraging a charge pump architecture like the one shown in FIG. 11, can also be used as part of a method to dynamically optimize PLL jitter performance. PLLs have a loop bandwidth that is dependent on, among other things, the charge pump current, the divide ratio, and the VCO gain. It is the case that reference clock input noise is low-pass filtered by the PLL, suggesting that it is best to minimize PLL bandwidth to minimize reference clock noise, while VCO noise is high-pass filtered by the PLL, suggesting it is best to maximize PLL bandwidth to minimize VCO noise. In a typical PLL design, this conflict is resolved by making assumptions about worst-case reference clock and VCO noise and choosing a bandwidth that reflects this static tradeoff. By leveraging the IPED in accordance with the present principles, e.g., an appropriate digital logic block and a charge pump circuit with features similar to those shown in FIG. 11, the setting of loop bandwidth can be performed dynamically to achieve optimized phase noise.

An input in FIG. 11 that is intended to be used to enable bandwidth control is the $C_{bw}$ input 730. To increase loop bandwidth, $C_{bw}$ can be increased (resulting in an increase in the charge pump current); to reduce loop bandwidth, $C_{bw}$ can be decreased (resulting in a decrease in the charge pump current). To generate a control signal determining whether the loop bandwidth should be increased or decreased, the digital control logic 570 shown in FIG. 7 could accumulate multiple lead/lag 540 samples, P 530 samples, and Pavg 531 samples and compute distribution information over multiple time windows to estimate frequency-referenced jitter. Once a measure of jitter is computed, a least mean squares or other optimization algorithm could be applied to dynamically determine and update loop parameters (such as loop bandwidth, in this case via charge pump current modulation) to optimize PLL jitter performance. Alternately, the system could be used to achieve a targeted, non-minimum amount of jitter.

Adjustment of charge pump current to optimize jitter performance is, of course, just one way to effect dynamic jitter minimization given the IPED infrastructure. Alternatives may include dynamically adjusting VCO gain, dynamically adjusting VCO bias current, modifying the behavior of base current reference generators, and others. Note that the jitter optimization and static phase offset compensation processes could be performed independently of each other or in tandem.

Having described preferred embodiments of a system and method automatic static phase error and jitter compensation in PLL circuits (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. An apparatus, comprising
a phase-locked loop (PLL) circuit including a first phase-frequency detector configured to output phase error signals;
a phase error monitor circuit configured to determine instantaneous peak phase error including:
a first gate configured to logically OR the output phase error signals as data to a first latch;
a second gate configured to logically combine the output phase error signals to clock the first latch;
a delay element to provide a delay to the data to the first latch where the output of the first latch provides instantaneous phase error change information;
a second latch coupled to the output phase error signals to output a lead/lag signal to indicate which of the output phase error signals is leading; and
an averager coupled to the first latch and configured to average the instantaneous peak phase error.

2. The apparatus as recited in claim 1, further comprising a third latch configured to store lock information captured by comparing phase error against a wider time span.

3. The apparatus as recited in claim 1, further comprising a logic device configured to receive a magnitude of the instantaneous phase error change information and the lag/lead signal to output a control signal.

4. The apparatus as recited in claim 3, further comprising a charge pump configured to receive the control signal and output an adjustment signal to control a voltage controlled oscillator.

5. The apparatus as recited in claim 4, further comprising a second phase-frequency detector having same inputs as the first phase-frequency detector and configured to provide up or down control of the charge pump.

6. The apparatus as recited in claim 4, wherein the adjustment signal controls a number of elements to activate in the charge pump.

7. The apparatus as recited in claim 6, wherein the number of elements includes at least one of current sources and current sinks which enable a controllable charge pump current mismatch between requested current in response to up and down pulses.

8. The apparatus as recited in claim 7, wherein the mismatch compensates for a phase offset.

9. The apparatus as recited in claim 3, wherein the logic device estimates frequency-referenced jitter and outputs a jitter control signal based on changes to the instantaneous phase error change information and the lead/lag signal to control the charge pump and adjust jitter performance.

10. An apparatus, comprising
an instantaneous phase error detector (IPED) circuit including:
a first gate configured to logically OR phase error signals output from a first phase-frequency detector as data to a first latch;
a second gate configured to logically combine the output phase error signals to clock the first latch;
a delay element to provide a delay to the data to the first latch where the output of the first latch provides a magnitude of instantaneous phase error change;
a second latch coupled to the phase error signals to output a lead/lag signal to indicate a direction of which of the phase error signals is leading;
a logic device configured to receive the magnitude and direction to generate a control signal; and
a charge pump phase locked loop (PLL) responsive to the control signal to control a voltage controlled oscillator wherein the charge pump PLL further comprises a second phase-frequency detector having same inputs as the first phase-frequency detector and configured to provide up or down control of a charge pump.

11. The apparatus as recited in claim 10, wherein the IPED further includes a third latch configured to store lock information captured by comparing phase error against a wider time span.

12. The apparatus as recited in claim 10, wherein the IPED further includes an averager coupled to die first latch and configured to average the instantaneous peak phase error.

13. The apparatus as recited in claim 10, wherein the logic device estimates frequency-referenced jitter and outputs a jitter control signal based on the magnitude and the direction to control the charge pump and adjust jitter performance.

14. The apparatus as recited in claim 10, wherein the charge pump PLL includes a charge pump having a number of elements activated in accordance with the control signal.

15. The apparatus as recited in claim 14, wherein the number of elements includes at least one of current sources and current sinks and the at least one of current sources and current sinks enable a controllable charge pump current mismatch between requested current in response to up and down pulses.

16. The apparatus as recited in claim 15, wherein the mismatch compensates for a phase offset.

17. An apparatus, comprising
a phase-locked loop (PLL) circuit including a first phase-frequency detector configured to output phase error signals;
a phase error monitor circuit configured to determine instantaneous peak phase error including:
a first gate configured to logically OR the output phase error signals as data to a first latch;
a second gate configured to logically combine the output phase error signals to clock the first latch;
a delay element to provide a delay to the data to the first latch where the output of the first latch provides instantaneous phase error change information;
a second latch coupled to the output phase error signals to output a lead/lag signal to indicate which of the output phase error signals is leading;
a logic device configured to receive a magnitude of the instantaneous phase error change information and the lag/lead signal to output a control signal;
a charge pump configured to receive the control signal and output an adjustment signal to control a voltage controlled oscillator; and
a second phase-frequency detector having same inputs as the first phase-frequency detector and configured to provide up or down control of the charge pump.

* * * * *